(12) United States Patent
Tang et al.

(10) Patent No.: US 6,222,771 B1
(45) Date of Patent: Apr. 24, 2001

(54) UNIFIED PROGRAM METHOD AND CIRCUITRY IN FLASH EEPROM

(75) Inventors: Yuan Tang; James C. Yu, both of San Jose, CA (US)

(73) Assignee: EON Silicon Devices, Inc., Santa Clara, CA (US)

( * ) Notice: Subject to any disclaimer, the term of this patent is extended or adjusted under 35 U.S.C. 154(b) by 0 days.

(21) Appl. No.: 09/494,456

(22) Filed: Jan. 31, 2000

(51) Int. Cl.⁷ .................................................. G11C 16/06
(52) U.S. Cl. ................................ 365/185.22; 365/185.2; 365/185.21
(58) Field of Search ........................... 365/185.2, 185.21, 365/185.22, 185.18, 185.28, 185.01

(56) References Cited

U.S. PATENT DOCUMENTS

| | | | |
|---|---|---|---|
| 5,712,815 | * 1/1998 | Bill et al. | 365/185.03 |
| 5,892,714 | * 4/1999 | Choi | 365/185.22 |
| 5,963,476 | * 10/1999 | Hung et al. | 365/185.22 |

* cited by examiner

*Primary Examiner*—David Nelms
*Assistant Examiner*—Hoai V. Ho
(74) *Attorney, Agent, or Firm*—Davis Chin

(57) ABSTRACT

A unified program method and circuitry for performing concurrently a programming and verifying operation in an array of Flash EEPROM memory cells is provided. Each of the memory cells includes a floating gate array core transistor. A single bandgap voltage is provided which corresponds to a predetermined amount of drain current at which programming is to be terminated. A program voltage is selectively connected to at least one of the columns of array bit lines containing the array core transistor which is to be programmed. A control gate bias voltage corresponding to a programmable memory state is selectively connected to the gate of the array core transistor. A core cell current flowing through the array core transistor and the predetermined amount of drain current is compared. The program voltage is disconnected so as to terminate automatically programming of the array core transistor when the core cell current falls below the predetermined amount of drain current.

17 Claims, 3 Drawing Sheets

UNIFIED PROGRAM METHOD AND CIRCUITRY IN FLASH EEPROM

BACKGROUND OF THE INVENTION

This invention relates generally to floating gate memory devices such as an array of flash electrically, erasable programmable read-only memory (EEPROM) cells. More particularly, the present invention relates to a unified program method and circuitry used in an array of Flash EEPROM memory cells for concurrently programming and verifying the programmable threshold voltage levels in the selected memory cells during programming which is simple in its construction and consumes less power than has been traditionally available.

As is generally well-known in the art, there have been provided electrical programmable and erasable memory array devices using a floating gate for the storage of charges thereon which are sometimes referred to as "Flash EPROMs or EEPROMs". In such conventional EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

Such EEPROMs are programmed in a conventional operation via hot-electron injection to the floating gate by application of high voltages to the control gate and the drain region which are above the potential applied to the source region. For example, the drain voltage applied is approximately +5.5 volts and the control gate voltage is approximately +12 volts. The source region is held at a ground potential. For the erasing operation by way of Fowler-Norheim tunneling, a positive voltage (e.g., +5 volts) is applied to the source region. A negative voltage (e.g., −8 volts) is applied to the control gate, and the drain region is allowed to float. In a read operation, the source region is held at a ground potential (0 volts) and the control gate has applied thereto a voltage of about +5 volts. The drain region is held at a voltage between +1 to +2 volts. Under these conditions, an unprogrammed or erased cell (storing a logic "1") will conduct a predetermined amount of current. On the other hand, the programmed cell (storing a logic "0") will not be rendered conductive. It should be clearly understood that the above examples are given for explanation only and that other voltage values may be used so as to provide similar programming, erasing, and reading operations.

In particular, there is known in the prior art of one conventional programming technique which applies a plurality of pulses in order to program a memory cell in a Flash EEPROM array from a logic state "1" to a logic state "0". After each programming pulse, a program verify operation is performed so as to read the state programmed in order to verify if the desired state has been achieved. Since bias conditions for the respective programming operation and program verify operation are quite different, this prior art programming technique suffers from the disadvantage of requiring additional time for switching between the two bias conditions. Further, if more than one programming pulse is required for programming the cell, there will be a substantial amount of time used for the non-programming operations. Another drawback encountered by the programming pulse technique is due to the fact that the actual programming time is discrete since it is determined by the total number of pulses applied. In addition, there will be a problem of over-programming associated with this programming technique if there is an upper limit for the programmed threshold voltage.

In an attempt to solve the problems discussed above with the programming pulse technique, there has been also provided heretofore in the prior art of a programming method for Flash EEPROM memory cells which combines the programming mode of operation with the program verify mode of operation into one step. Such a program method is described and illustrated in U.S. Pat. No. 5,712,815 to C. S. Bill et al. entitled "Multiple Bits Per-Cell Flash EEPROM Capable of Concurrently Programming and Verifying Memory Cells and Reference Cells," which is hereby incorporated by reference in its entirety.

This '815 patent is based upon a different hot carrier injection mechanism, i.e., drain-side injection at low drain current levels, than the conventional channel hot-carrier injection mechanism used in most Flash EEPROM memory devices. Thus, the program method in the '815 patent suffers from the disadvantage of requiring special circuit elements so as to accommodate the drain-side injection mechanism. In particular, as can be seen from FIG. 5 of the patent, the program method utilizes a program current source circuitry 36a which includes a current source $I_s$. Further, in order to program a memory cell to different program states (multiple bits-per-cell) the bandgap reference derived voltage BGR from a reference generator 134 must be selectively set to one of the target program-verify voltages (corresponding to each program state).

Accordingly, there has been developed by the inventor an improved unified program method and circuitry for use in Flash EEPROM memory cells which is relatively simple in its construction and consumes a small amount of power. The unified program method of the present invention requires only a single bandgap reference voltage and does not require the need of a current source. The present invention represent a significant improvement over the aforementioned '815 patent of the prior art.

SUMMARY OF THE INVENTION

Accordingly, it is a general object of the present invention to provide an improved programming method and circuitry used in an array of Flash EEPROM memory cells which is relatively simple in its construction and is economical to manufacture and assemble, but overcomes the disadvantages of the prior art programming techniques.

It is an object of the present invention to provide a unified program method and circuitry used in an array of Flash EEPROM memory cells for concurrently programming and verifying the programmable threshold voltage levels in the selected memory cells during programming without requiring the need of a current source.

It is another object of the present invention to provide a unified program method and circuitry used in an array of Flash EEPROM memory cells for concurrently programming and verifying the programable threshold voltage levels in the selected memory cells during programming which requires only a single bandgap reference voltage.

It is still another object of the present invention to provide an improved unified program method and circuitry used in an array of single-bit or multiple-bit Flash EEPROM memory cells for concurrently programming and verifying the programmable threshold voltage levels in the selected memory cells without the need of modifications.

In a preferred embodiment of the present invention, there is provided a unified program method and circuitry for performing concurrently a programming and verifying operation in an array of Flash EEPROM memory cells. A plurality of memory cells are arranged in rows of wordlines and columns of bit lines intersecting the rows of wordlines. Each of the memory cells includes a floating gate array core transistor having its control gate connected to one of the rows of wordlines, its drain connected to one of the columns of bit lines, and its source and substrate connected to a ground potential. A single bandgap voltage is provided which corresponds to a predetermined amount of drain current at which programming is to be terminated.

A program voltage is selectively connected to at least one of the columns of array bit lines containing the array core transistor which is to be programmed. A control gate bias voltage corresponding to a programable memory state is selectively connected to the gate of the array core transistor which is to be programmed. A core cell current flowing through the array core transistor which is to be programmed and the predetermined amount of drain current is compared. The program voltage is disconnected so as to terminate automatically programming of the array core transistor when the core cell current falls below the predetermined amount of drain current.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

A new and novel unified program method and circuitry for performing concurrently a program and verifying operation in an array of Flash EEPROM memory cells is described. In the following description, numerous specific details are set forth, such as specific circuit configurations, components and the like in order to provide a thorough understanding of the present invention. However, it should be apparent to those skilled in the art that the present invention may be practiced without the specific details. In other instances, well-known processes, circuits and control lines, not particularly relevant to the understanding of the operating principles of the present invention, have been purposely omitted for the sake of clarity.

Figure 1:
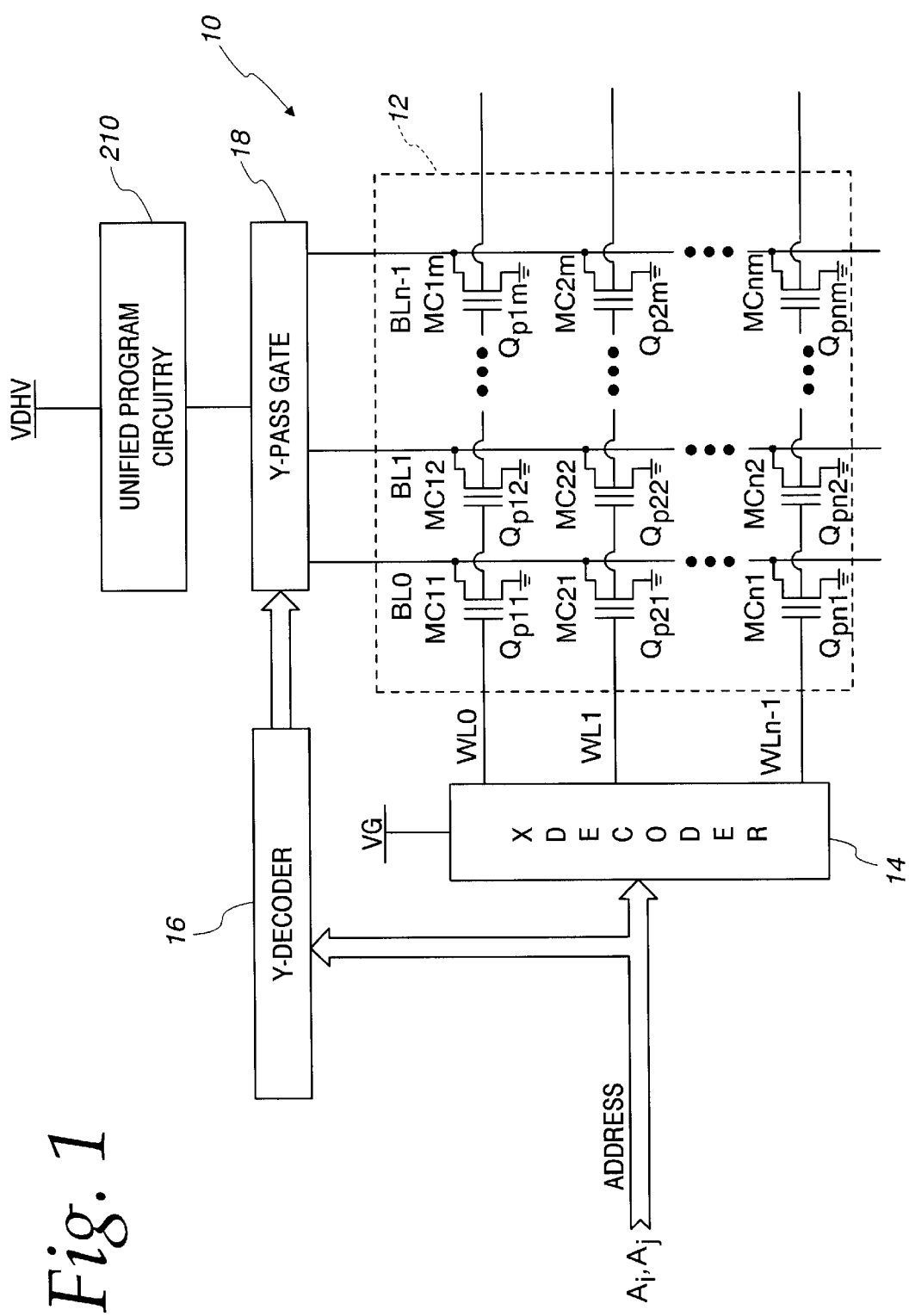
FIG. 1 is a simplified block diagram of an EEPROM semiconductor integrated circuit memory device having a unified program circuitry, constructed in accordance with the principles of the present invention.

Referring now in detail to the drawings, there is shown in FIG. 1 an EEPROM semiconductor integrated memory circuit device 10 which includes an improved unified program circuitry 210 of the present invention for performing concurrently a programming and program verifying operation in an array of single-bit or multiple-bits Flash electrically erasable read-only memory (EEPROM) cells of the memory device through use of a conventional channel hot-electron programming mechanism. As a result, the unified program circuitry is relatively simple in its construction, consumes a smaller amount of power, and eliminates the need of a current source. Further, the same unified program circuitry 210 may be used for either single-bit per cell programming or multiple-bits per cell programming without any needed modifications. In addition, only a single bandgap reference generator voltage is required to program a memory cell into multiple programmable memory states.

The EEPROM integrated memory circuit memory device 10 includes a memory core cell array 12, a row address decoder 14, a column address decoder 16, and a Y-pass gate circuit 18. For example, the memory core cell array 12 includes approximately 16 million core cells arranged in a regular matrix pattern of $2^{12}$ rows and $2^{12}$ columns. Thus, for the single-bit per cell memory device there is stored 16 Mb of data or information. For the multiple-bits per cell (two-bits per cell) memory device, the 16 Mb of memory cells can actually store 32 Mb of data since two bits of data per cell is being stored. Thus, a double density storing capacity has been achieved. Row address signals $A_i$ are fed to the row address decoder 14, and the column address signals $A_j$ are fed to the column address decoder 16. The row address decoder 14 selects one of the plurality of wordlines in the memory core cell array 12 in response to the row address signals. The Y-pass gate circuit 18 connects corresponding array bit lines to the unified program circuitry 210.

The memory core array 12 is formed of memory core cells MC11 through MCnm which are arranged in the form of a matrix. The core cells MC11, MC12, . . . MC1m are arranged in the same row and have their selection terminals connected to the same common wordline $WL_0$. Similarly, the memory core cells MC21, MC22, . . . MC2m are arranged in the same row and have their selection terminals connected to the common wordline $WL_1$. This is likewise done for each of the remaining rows in the memory array 12. Finally, the memory core cells MCn1, MCn2, MCnm are arranged in the same row and have their selection terminals connected to the common wordline $WL_{n-1}$. Also, the core cells MC11, MC21, MCn1; the core cells MC12, MC22, . . . MCn2; and the core cells MC1m, MC2m, . . . MCnm are arranged in the same respective columns and have their corresponding data terminals connected to associated common bit lines $BL_0$, $BL_1$, . . . $BL_{n-1}$, respectively.

Each of the memory core cells MC11 through MCnm is comprised of one of the corresponding array floating gate transistors $Q_{p11}$ –$Q_{pnm}$. The array transistors $Q_{p11-Qpnm}$ function as a memory transistor for storing data or logic levels "1" or "0" therein for the single-bit per cell. There are four data or logic levels "11", "10", "01", and "00" for the two-bits per cell. Each of the array transistors has its gate connected to one of the rows of wordlines, its drain connected to one of the columns of bit lines, and its source and substrate connected to a common array ground line VSS.

During the concurrent programming and verifying operation, the bit line(s) containing the memory cell(s) to be programmed is selected by the column address decoder 16 and the Y-pass gate circuit 18 so as to apply a program voltage VDHV to the drain of the selected core transistor through the Y-pass gate circuit 18. Similarly, the wordline(s) of the memory cell(s) to be programmed is selected by the row address decoder 14 so as to apply a gate bias voltage $V_G$ to the control gate of the selected core transistor. The unified program circuitry 210 of the present invention is operatively connected between the program voltage VDHV and the Y-pass gate circuit 18.

Figure 2:
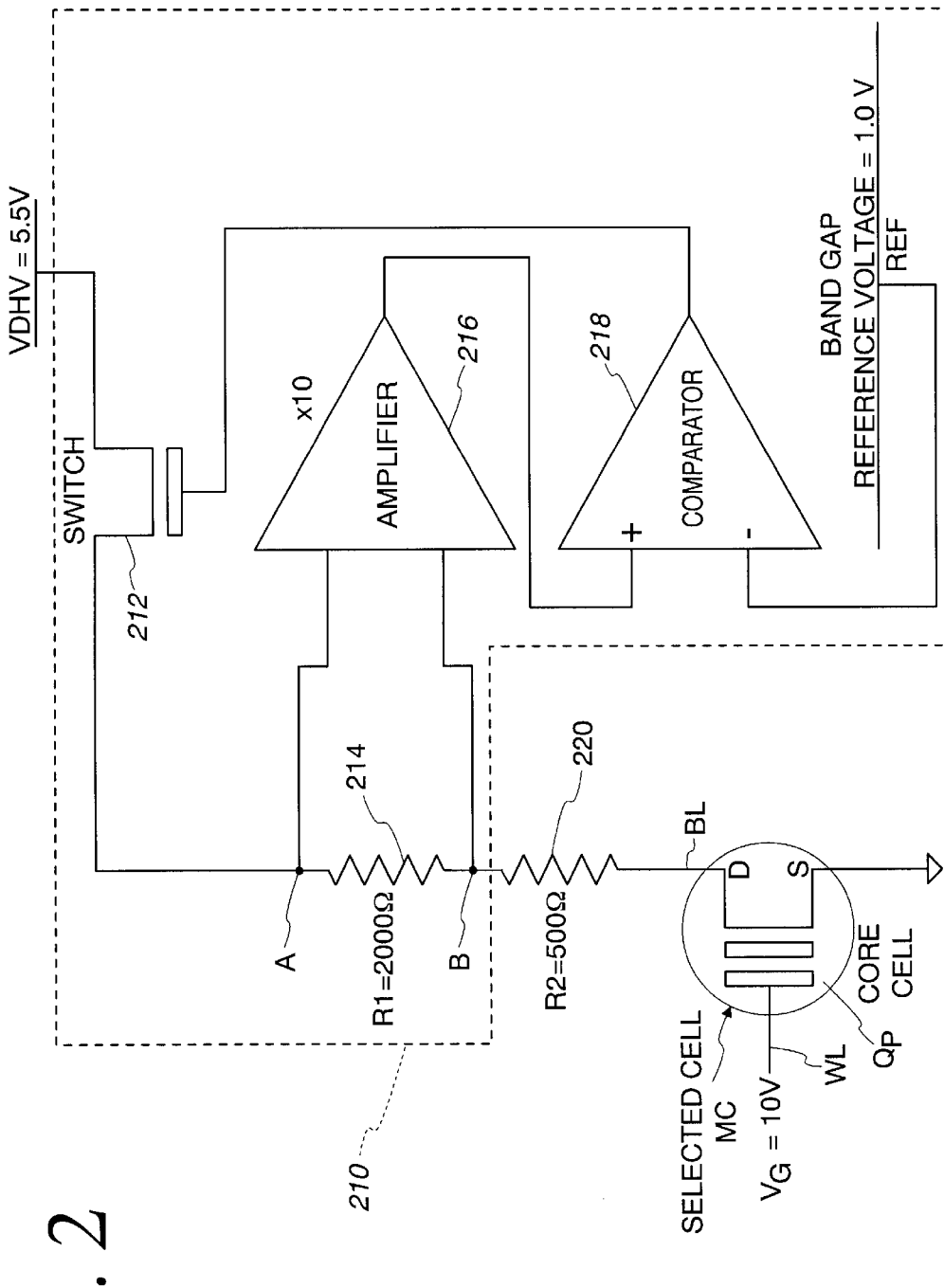
FIG. 2 is a schematic circuit diagram of the unified program circuitry of FIG. 1 for use with a memory cell MC connected to a bit line BL.

In FIG. 2, there is illustrated a schematic circuit diagram of the unified program circuitry 210 of FIG. 1 for use with a selected memory cell MC of the memory core array 12 connected to the array bit line BL. The unified program circuitry includes a switch transistor 212, a sense resistor 214, a differential gain amplifier 216, and a comparator 218. The switch transistor 212 has its drain connected to a program voltage VDHV, which is typically at +5.5 volts, its source connected to one end of the sense resistor 214 at a node A and to a first input of the amplifier 216, and its gate connected to the output of the comparator 218. The second input of the amplifier 216 is connected to the other end of the sense resistor 214 at a node B. The output of the amplifier 216 is connected to the non-inverting input of the comparator 218. The inverting input the comparator 218 is connected to a bandgap reference voltage, which is typically at +1.0 volts. The bandgap reference voltage may be generated from a reference bandgap generator (not shown). The node B is also joined to the drain of the selected core transistor $Q_p$ via a resistor 220 and the selected bit line BL. The resistor 220 has a value R2 which represents the lumped resistance such as associated with the Y-pass gate circuit and the conductive leads.

It should be noted that, unlike the prior art of the '815 patent, there is not required a current source $I_S$ and only a single bandgap reference voltage REF is used. Further, it can be seen that the control gate of the selected core transistor $Q_p$ is connected to a fixed gate bias $V_G$ which is adjustable via the selected wordline WL.

The improved unified program circuitry 210 of the present invention for concurrently programming and verifying a programmable threshold voltage $V_{PT}$ of the core transistor $Q_P$ in FIG. 2 will now be explained in detail with reference to FIG. 3. However, an explanation will first be given with respect to the three curves namely, curve-1, curve-2, and curve-3. Curve-1 show the current $I_{DS}$ flowing through the drain of the core transistor $Q_P$ and through the series resistors 214, 220 as a function of the threshold voltage $V_T$ of the core transistor when the control gate thereof is biased at a fixed gate voltage of $V_G$=+10 volts. Similarly, the curve-2 shows the current $I_{DS}$ as in the curve-1, except for a fixed gate voltage of $V_G$=+8.5 volts. Likewise, the curve-3 shows the current $I_{DS}$ as in the curve-1, except for a fixed gate voltage of $V_G$=+7.5 volts.

In all three curves, it can the seen that be higher the threshold voltage $V_T$ is, the lower the current $I_{DS}$ will be. Thus, a low $V_T$ represents an erased state "1" and a high $V_T$ represents a programmed state "0". When a cell is programmed to reach the state "0", the current decreases significantly from a higher value when the programming has just begun (erased state). For example, the curve-1 illustrates that for the fixed gate voltage of $V_G$=+10 volts and the threshold voltage $V_T$=+1.5 volts, the current $I_{DS}$ is quite large and is equal to approximately 200 μA at the beginning of programming.

The present invention utilizes this drain current difference to detect when the selected memory cell has reach the state "0" and thus terminates the programming automatically. This is also the point of verifying. Therefore, no separate operation is required to be performed verifying the programmed level.

Initially, the sense resistor 214 is selected to have a resistance value of R1=2000 Ω and it is assumed that the resistor 220 has a resistance value of R2=500 Ω. Prior to the commencement of the programming operation, the selected memory cell MC is in the erased state or state "1", i.e., threshold voltage $V_T$ of the selected cell is below +1.5 volts. Assume that the threshold voltage $V_T$ of the selected memory cell is at +1.5 volts. In order to begin the programming operation, the gate bias $V_G$+10 volts and the program voltage VDHV=+5.5 volts are both turned ON. For the present time, it is assumed that the switch transistor 212 is rendered conductive so as to apply the program voltage, such as +5 volts to the drain of the selected memory cell MC. The drain voltage will be smaller than the program voltage +5.5 volts due to the voltage drops across the resistors 214 and 220.

Figure 3:
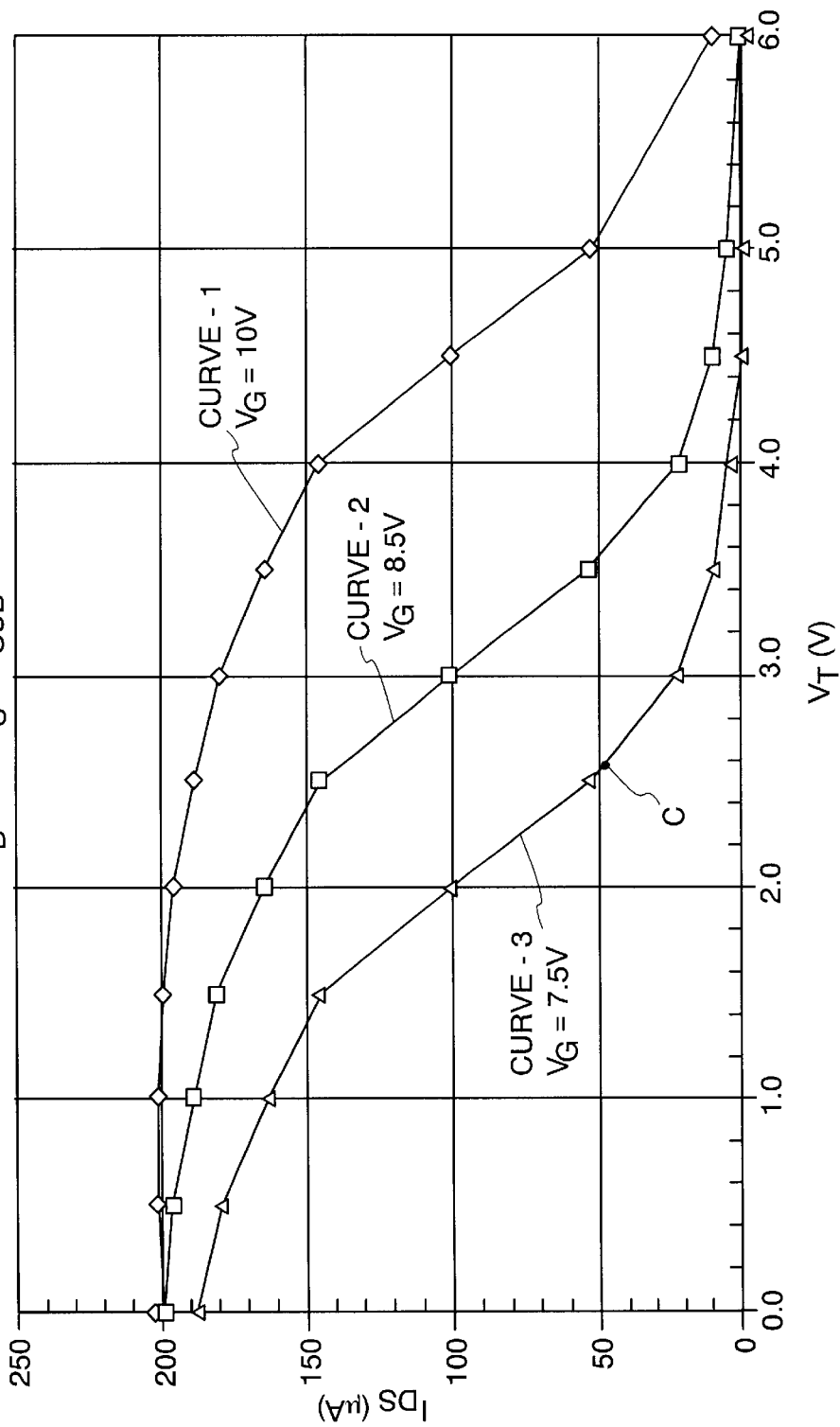
FIG. 3 is a family of curves representing the drain current $I_{DS}$ of the core cell transistors as a function of core cell threshold voltage $V_T$ for different control gate bias $V_G$.

In order to determine the voltage drops across the resistors 214 and 220, reference is made to the curve-1 of FIG. 3. As can be seen, at the low $V_T$ of +1.5 volts, the current $I_{DS}$ will be about 200 μA. Since the same current flows through the resistors 214 and 220, the voltage drops across the resistor 214 will be approximately 200 μA×2000 Ω=400 mV=0.4 V. Similarly, the voltage drop across the resistor 220 will be 200 μA×500 Ω=100 mV=0.1 V. Therefore, at the beginning of the programming operation the drain voltage $V_D$ can be calculated as follows: $V_D$=VDHV−0.4 V−0.1 V=5.5−0.5= 5.0 volts.

Assuming that the amplifier 218 has a gain of 10, the voltage drop of 0.4 V across the sense resistor 214 will create an amplified voltage of +4 V at the output of the amplifier. This amplified voltage is compared with the bandgap reference voltage of +1.0 V by the comparator 218. The output of the comparator will be at a logic "high" level since the amplified voltage is greater than the bandgap reference voltage. As a consequence, the switch transistor 212 is maintained ON and the programming operation will continue. Therefore, for a short interval of time large amounts of electrons will be injected into the floating gate of the core transistor and will thus significantly increase its threshold voltage $V_T$. As the threshold voltage $V_T$ increases, the current $I_{DS}$ will decrease along the curve-1.

On the other hand, when the amplified voltage falls below the bandgap reference voltage REF which corresponds to the voltage drop across the sense resistor 214 of 1 V/10 or 100 mV, the switch transistor 212 will be turned OFF by the comparator and programming will be terminated automatically. The current $I_{DS}$ flowing through the sense resistor 214 at that point will be equal to 100 mV/2000 or 50 μA. By referring to the curve-1 again, it will be noted that the current of 50 μA corresponds to a threshold voltage $V_T$ of +5 V. Thus, it is known immediately that the selected core cell MC has been programmed to about 5 V (from the erased state of +1.5 V).

For the single or one-bit per cell Flash memory device described above, each of the memory core cells is either in an erased state (state "1") corresponding to an erased threshold voltage $V_{TE}$ (i.e., <1.5 V) or in a high state (state "0") corresponding to a high threshold voltage $V_{TP}$ (i.e., >+5.0 V). For the two-bits per cell (double density) Flash memory device, each of the memory core cells must have its threshold voltage set (programmable) to three higher levels than the erased state. As a result, there are required four threshold voltage levels or programmable memory states.

Thus, the erased threshold voltage will now correspond to an erased state "11," and the high threshold voltage will correspond to a third higher level $V_{TP3}$ or a programmable memory state "00." Two more threshold voltage levels or programmable memory states consisting of a first higher level $V_{TP1}$ or a programmable memory state "10" and a second higher level $V_{TP2}$ or a programmable memory state "01" must be inserted between the erased state "11" and the third programmable memory state "00." With the threshold voltage of less than +1.5 V corresponding to the erased state and the threshold voltage greater than +5.0 V corresponding to the third higher level $V_{TP3}$, the threshold voltage of +2.5 V is, for example, selected to be the first higher level $V_{TP1}$ and the threshold voltage of +3.5 V is selected to be the second higher level $V_{TP2}$.

The unified program circuitry 210 of FIG. 2 may be used generally to program a core cell such as the memory core cell MC to any threshold voltage value higher than its erased state. For the purpose of illustration, it will be assumed that it is desired to program the memory cell MC having the erase threshold voltage $V_{TE}$=+1.5 V to the second higher level $V_{TP2}$ (programmable memory state "01"). The gate bias voltage $V_G$ is now adjusted to +8.5 V rather than +10 V. When the bias applied to the control gate of the cell transistor $Q_P$ is lowered, the drain current $I_{DS}$ will be reduced correspondingly for the cell with the same erased threshold voltage $V_{TE}$. In other words, this is equivalent to shifting of the curve-1 of FIG. 3 to the left until it reaches the curve-2.

At the start of programming, the drain current $I_{DS}$ as determined from the curve-2 will only be about 180 μA this time at the erased threshold voltage $V_{TE}$ of +1.5 V. The voltage drop of 0.36 V across the sense transistor 214 will generate the amplified voltage of +3.6 V at the output of the amplifier. This, in turn, will cause the output of the comparator to be "high" so as to maintain the switch transistor 212 ON and thus programming will continue. Therefore, the channel hot electrons will be injected onto the floating gate while the selected cell transistor $Q_P$ to be programmed, causing its threshold voltage to increase continuously. The drain current $I_{DS}$ will decrease along the curve-2 as the threshold voltage increases. Again, when the current $I_{DS}$ decreases to 50 μA where programming is to be terminated, the switch transistor 212 will be turned OFF, as previously described, and programming will be terminated automatically. As can be seen from the curve-2, the current of 50 μA corresponds to a threshold voltage of +3.5 V. Thus, it is immediately known that the selected cell has been programmed to about +3.5 V.

It should be apparent to those skilled in the art that since the unified program circuitry 210 of the present invention will program the memory cell transistor to a threshold of +5 V when the gate bias $V_G$=+10 V is applied to its control gate based upon the curve-1 of FIG. 3, then the cell transistor may be programmed to a reduced a threshold level of $V_T$=5 V−$\Delta V_T$ when the gate bias is correspondingly reduced to $V_G$=10 V−$\Delta V_T$. For example, if $\Delta V_T$=+1.5 V, then the cell transistor will be programmed to $V_T$=5 V−1.5 V or +3.5 V (programmable memory state "01") when the gate bias is decreased to $V_G$=10 V−1.5 V or +8.5 V. Similarly, if $\Delta V_T$=2.5 V, then the cell transistor will be programmed to $V_T$=5 V−2.5 V or +2.5 V (programmable memory state "10") when the gate bias is decreased to $V_G$=10 V−2.5 V or +7.5 V. The curve-3 illustrates the case when the gate bias $V_G$ is adjusted to +7.5 V for programming. Thus, when the current $I_{DS}$ decreases to 50 μA again at point C programming will terminated automatically which corresponds to the first higher voltage level of +2.5 V.

It should be clearly understood that the unified program circuitry 210 of the present invention may be used to theoretically and potentially program a memory cell in any number of different threshold voltage levels or programmable memory states by utilizing only a single bandgap reference voltage and by adjusting the gate bias correspondingly for the different desired threshold voltage levels.

Therefore, the present method can be extended to programming of 3-bits per cell (8 states), 4-bits per cell (16 states), . . . and so on without adding any complexity to the programming circuitry 210. Also, it will be observed that the programming is terminated in the instant invention at the same drain current (i.e., 50 μA) irrespective of the desired threshold voltage level to be programmed. As a result, there will be achieved a narrower threshold voltage distribution after programming in the Flash EEPROM.

From the foregoing detailed description, it can thus be seen that the present invention provides a unified program method and circuitry for performing concurrently programming and verifying operations in an array of Flash EEPROM memory cells. The present invention is implemented in a very simple and reliable way by utilizing the voltage drops across a sense resistor. The current flowing through the sense resistor represents a core cell current of the core transistor which is to be programmed. When the core cell current falls, as a direct consequence of programming, below the predetermined amount of drain current, a program voltage is disconnected so as to terminate automatically further programming of the core transistor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A unified program method for performing concurrently a program and verifying operation in an array of flash EEPROM memory cell, said program method comprising the steps of:

providing a plurality of memory cells arranged in rows of wordlines and columns of bit lines intersecting said rows of wordlines, each of said memory cells including a floating gate array core transistor having its control gate connected to one of said rows of wordline, its drain connected to one of said columns of bit lines, and its source and substrate connected to a ground potential;

providing a single bandgap reference voltage corresponding to a predetermined amount drain current at which programming is to be terminated;

selectively connecting a program voltage to at least one of the columns of bit lines containing said array core transistor which is to be programmed;

selectively connecting a control gate bias voltage corresponding to a programmable memory state to the gate of said array core transistor which is to be programmed;

connecting a sense resistor in series with said at least one of the columns of bit lines for determining the core cell current flowing through said array core transistor which is to be programmed;

amplifying a voltage drop across the sense resistor to produce an amplified voltage;

comparing the amplified voltage corresponding to the core cell current flowing through said array core transistor which is to be programmed and the reference voltage corresponding to said predetermined amount of drain current; and disconnecting said program voltage so as to terminate automatically further programming of said array core transistor when said core cell current falls below said predetermined amount of drain current.

2. The unified program method as claimed in claim 1, wherein said bandgap reference voltage is approximately +1 V and said program voltage is about +5.5 V.

3. The unified program method as claimed in claim 2, wherein said predetermined amount of drain current is about 50 μA.

4. The unified program method as claimed in claim 1, further comprising the step of adjusting the control gate bias voltage applied to the gate of said array core transistor to program to a different programmable memory state.

5. The unified program method as claimed in claim 4, wherein said control gate bias voltage is adjusted between 10 volts and 0 volts.

6. The unified program method as claimed in claim 5, wherein the control gate bias voltage is adjusted to +10 volts to produce a first programmable memory state.

7. The unified program method as claimed in claim 6, wherein the control gate bias voltage is adjusted to +8.5 volts to produce a second programmable memory state.

8. The unified program method as claimed in claim 7, wherein the control gate bias voltage is adjusted to +7.5 volts to produce a third programmable memory state.

9. In a semiconductor integrated circuit having unified program circuitry for performing concurrently a programming and verifying operation in an array of flash EEPROM memory cells, said program circuitry comprising:

a plurality of memory cells arranged in rows of wordlines and columns of bit lines intersecting said rows of wordlines, each of said memory cells including a floating gate array core transistor having its control gate connected to one of said rows of wordline, its drain connected to one of said columns of bit lines, and its source and substrate connected to a ground potential;

a single bandgap reference voltage corresponding to a predetermined amount drain current at which programming is to be terminated;

a program voltage being selectively connected to at least one of the columns of bit lines containing said array core transistor which is to be programmed;

a control gate bias voltage corresponding to a programmable memory state being selectively connected to the gate of said array core transistor which is to be programmed;

means for comparing a core cell current flowing through said array core transistor which is to be programmed and said predetermined amount of drain current and generating a low logic when said core cell current falls below said predetermined amount of drain current;

said means for comparing including a sense resistor connected in series with the drain of said array core transistor which is to be programmed, amplifier means for amplifying a voltage drop across said sense resistor to produce an amplified voltage and comparator means being responsive to said amplified voltage and said reference voltage for generating said low logic on its output; and switching means responsive to said low logic for disconnecting said program voltage so as to terminate automatically further programming of said array core transistor.

10. In the semiconductor integrated circuit as claimed in claim 9, wherein said switching means includes a transistor having its drain connected to the program voltage, its source to one end of said sense resistor, and its gate connected to the output of said comparator means, the other end of said sense resistor being connected to the drain of said array core transistor.

11. In the semiconductor integrated circuit as claimed in claim 9, wherein said bandgap reference voltage is approximately +1 V and said program voltage is about +5.5 V.

12. In the semiconductor integrated circuit as claimed in claim 11, wherein said predetermined amount drain current is about 50 μA.

13. In the semiconductor integrated circuit as claimed in claim 9, further comprising means for adjusting the control gate bias voltage applied to the gate of said array core transistor to program to a different programmable memory state.

14. In the semiconductor integrated circuit as claimed in claim 13, wherein said control gate bias voltage is adjusted between 10 volts and 0 volts.

15. In the semiconductor integrated circuit as claimed in claim 14, wherein the control gate bias voltage is adjusted to +10 volts to produce a first programmable memory state.

16. In the semiconductor integrated circuit as claimed in claim 15, wherein the control gate bias voltage is adjusted to +8.5 volts to produce a second programmable memory state.

17. In the semiconductor integrated circuit as claimed in claim 16, wherein the control gate bias voltage is adjusted to +7.5 volts to produce a third programmable memory state.

* * * * *